United States Patent [19]
Boettcher

[11] Patent Number: 6,162,718
[45] Date of Patent: Dec. 19, 2000

[54] HIGH SPEED BUMP PLATING/FORMING

[75] Inventor: Mathias Boettcher, Dresden, Germany

[73] Assignee: Advanced Micro Devices, Sunnyvale, Calif.

[21] Appl. No.: 09/148,265

[22] Filed: Sep. 4, 1998

[51] Int. Cl.[7] .................................................. H01L 21/44
[52] U.S. Cl. ........................... 438/613; 438/614; 438/615
[58] Field of Search .................................... 438/613, 612, 438/614, 615

[56] References Cited

U.S. PATENT DOCUMENTS

| | | |
|---|---|---|
| 5,854,513 | 12/1998 | Kim . |
| 5,937,320 | 8/1999 | Andricacos et al. . |
| 5,989,993 | 11/1999 | Zakel et al. . |
| 6,008,543 | 12/1999 | Iwabuchi . |
| 6,030,890 | 2/2000 | Iwabuchi . |

FOREIGN PATENT DOCUMENTS

| | | |
|---|---|---|
| 07201860 | 8/1995 | Japan . |
| 08213402 | 8/1996 | Japan . |
| 09074096 | 3/1997 | Japan . |
| 409283525A | 10/1997 | Japan . |

*Primary Examiner*—Charles Bowers
*Assistant Examiner*—Evan Pert

[57] ABSTRACT

A plurality of uniform bumps are formed on a semiconductor device by forming a plurality of bond limiting metallization areas. The surface of the semiconductor device is then plated with a plating metal that will be alloyed with the solder of the solder bump, said solder and the plating material forming an alloy during the reflowing step. A mask is then placed onto the surface of the semiconductor device. Openings are made in the mask that correspond to the plurality of bond limiting metallization areas on the surface of the semiconductor device. The plurality of bond limiting metallization areas are also the electrical contact pads. Solder is then deposited through the openings in the mask at a rate of solder deposition which provides a uniform thickness of solder across the surface of the wafer which is later diced into many chips. The openings formed in the mask have substantially a bigger footprint or area associated with each pad. Since the solder balls are at the same height, the solder balls have approximately the same volume. Next, the mask and plating layer beneath the mask are removed leaving a substantially uniform volume of solder and plating material positioned on and near the plurality of bond limiting metallization areas. The next step is to reflow the solder to form substantially uniform solder balls or bumps on each pad across the wafer by consuming the plating metal. The plating material beneath the solder alloys with the solder during this step. In addition, the solder and plating material gathers on each bond limiting metallization area to form bumps which are uniform in height and volume.

20 Claims, 7 Drawing Sheets

HIGH SPEED BUMP PLATING/FORMING

FIELD OF THE INVENTION

The invention relates to semiconductor device assemblies, and more particularly to techniques for forming external connections with raised ball bump type contacts on an exterior surface of a semiconductor.

BACKGROUND OF THE INVENTION

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

In the past the die and package were first attached and then were wire bonded. The wire bonding procedure is simple in concept. A thin (0.7 to 1.0 mil) wire is first bonded to the chip bonding pad and spanned to the inner lead of the package lead frame. The third action was to bond the wire to the inner lead. Lastly, the wire is clipped and the entire process repeated at the next bonding pad. While simple in concept and procedure, wire bonding was critical because of the precise wire placement and electrical contact requirements. In addition to accurate placement, each and every wire must make a good electrical contact at both ends, span between the pad and the inner lead in a prescribed loop without kinks and be at a safe distance from neighboring lead wires. Wire loops in these packages are 8 to 12 mils, while those of ultrathin packages are 4 to 5 mils. The distance between adjacent wires is called the pitch of the bonding. Wire bonding has been done with either gold or aluminum wires. Both types of wire are highly conductive and ductile enough to withstand deformation during the bonding steps and remain strong and reliable.

Wire bonding between a die and a package has several problems. One problem is that a wire bond attachment to a die limits the number of pads and placement of the pads on the die. In addition, minimum height limits are imposed by the required wire loops. Another problem is that there is a chance of electrical performance problems or shorting if the wires come too close to each other. The wire bonds also require two bonds and must be placed one-by-one and there are resistances associated with each bond. The wires are also relatively long.

To increase the number of pad sites available for a die and to address the problems stated above and other problems, dies were provided with deposited metal bumps on each bonding pad. The bonding pads were also moved to the side of the die nearest the transistors and other circuit devices formed in the die. As a result, the electrical path to the pad is shorter. Connection to the package is made when the chip is flipped over and soldered. As a result, the dies are commonly called flip chips in the industry. Each bump connects to a corresponding package inner lead. The packages which result are lower profile and have lower electrical resistance and a shortened electrical path. The plurality of ball-shaped conductive bump contacts (usually solder, or other similar conductive material) are typically disposed in a rectangular array. The packages are occasionally referred to as "Ball Grid Array" (BGA) or "Area Grid Array" packages or Chip Size Packages (CSP's).

A typical BGA package is characterized by a large number of solder balls disposed in an array on a surface of the package. It is not uncommon to have hundreds of solder balls in an array. The BGA package is assembled to a matching array of conductive pads. The pads are connected to other devices within a substrate or circuitry on a circuit board. Heat is applied to reflow the solder balls (bumps) on the package, thereby wetting the pads on the substrates and, once cooled, forming electrical connections between the package and the semiconductor device contained in the package and the substrate.

The introduction of flip chips and Ball Grid Array (BGA) packages to the semiconductor industry have brought several new manufacturing and assembly challenges. One of the more significant problems is finding an efficient, cost-effective technique for applying the solder ball contacts to the die or package surface. The die surface is usually formed from an electrically insulating material, usually silicon dioxide, with a pattern of metallized pads disposed thereupon for connecting to the package. The package is attached to an external system via a circuit board.

One of the larger challenges is keeping the height of solder ball contacts substantially uniform. This is a critical factor for successful attachment of flip chips to BGA-type packages. If one or more balls are significantly shorter than others it becomes highly likely that these smaller (shorter) contacts will completely miss their mating contact pads and will fail to form an electrical connection between the semiconductor device and the package. Another challenge is to keep the volume of solder associated with each pad essentially the same. If one pad is provided with too much solder, it may contact a neighboring pad on the die. This is an unwanted contact or short to another pad on the die.

In semiconductor manufacturing, a wafer is processed to form many individual chips (also known as dies). The wafer is diced to form the individual chips. Currently, bumps are formed on the chips or dies when they are still in wafer form. One of the final steps in the semiconductor manufacturing process is to form the actual pads on the surface of the chips. If the chips are flip chips, solder is then deposited on each pad. As mentioned above the amount per pad must be consistent so that a consistent set of bumps are formed when the solder is reflowed. Currently, solder is deposited at a rate of 0.6–0.8 micrometers/minute so that solder is deposited consistently on each pad across the wafer. Solder can be deposited at much faster rates, however, at the higher rates, depositing a consistent amount of solder on each pad is not possible. Differing amounts of solder on each pad may produce a short or an open as discussed above.

The slow deposition rate of solder onto the pads of each chip on a wafer is an obstacle to higher manufacturing rates. Many current manufacturing processes have slow throughput, and their deposition of solder onto the wafer can be a bottleneck in the manufacturing process.

As more and more capability is being designed into electronic devices, such as memory chips and microprocessor chips, the number of input/output elements or pads are being vastly increased. Therefore, a controlled process is also needed.

SUMMARY OF THE INVENTION

According to one example embodiment of the present invention, a plurality of uniform bumps are formed on a semiconductor device by forming a plurality of bond limiting metallization areas. The surface of the semiconductor device is then plated with a plating metal or metal system that will be alloyed with the solder of the solder bump. The solder and the plating material form an alloy during the reflowing step. A mask is then placed onto the surface of the semiconductor device. Openings are made in the mask that correspond to the plurality of bond limiting metallization areas on the surface of the semiconductor device. The openings have a larger area than the pad (see FIG. 4F). The plurality of bond limiting metallization ("BLM") areas are also placed on the electrical contact pads. The bond limiting metallization area is then structured to form the area to which a solder ball or pad will attach to the surface of the semiconductor. A plating layer is then placed atop the contact pads having bond metallization thereon as well as the surface of the semiconductor. A plating mask is then formed. The openings in the plating mask have an area greater than the area of the semiconductor which is covering the pad and base metallization layers. Solder is then deposited onto the plating material through the openings in the mask at a rate of solder deposition which provides a uniform thickness of solder across the surface of the wafer which is later diced into many chips. The openings formed in the mask have substantially a bigger footprint or area associated with each pad. Since the solder pads are at the same height, the solder pads have approximately the same volume. Next, the mask and plating layer beneath the mask are removed leaving a substantially uniform volume of solder and plating material positioned on and near the plurality of bond limiting metallization areas. The next step is to reflow the solder to form substantially uniform solder balls or bumps on each pad across the wafer. The plating base material beneath the solder alloys with the solder during this step. In addition, the solder and plating base material gathers on each bond limiting metallization area to form bumps which are uniform in height and volume.

According to another example embodiment, the area of the solder mask is larger than the area of bond limiting metallization, and the thickness of the solder laid down or deposited at a uniform thickness across the wafer can be thinner to achieve the same volume as when the mask opening area equals the area of the base limiting metallization. Because of the bigger area, the plating time is cut down more or less as an inverse of the greater area. In other words, if the area of the opening in the plating mask is 2–3 times as large as the base limiting metallization area on the surface, the plating time is cut in one-half or a third. The electroplating is done at the same rate but over a shorter time. As a result, the processing time for the wafer devoted to the electroplating process can be lessened. Throughput for adding solder bumps to electrical contact pads can be improved and uniformity of the bumps can be assured. This process can also be adapted to any pattern of solder bumps and can also be adapted to make solder bumps for densely packed contacts which will come in the future.

BRIEF DESCRIPTION OF THE DRAWINGS

The following detailed description of the preferred embodiments can best be understood when read in conjunction with the following drawings, in which.

Figure 1:
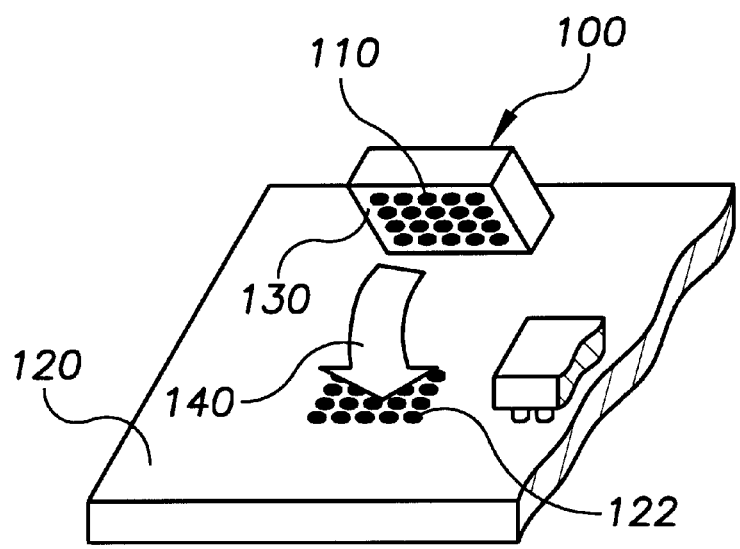
FIG. 1 shows a perspective view of a flip chip, consistent with the invention described herein, having solder bumps being attached a surface.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

DETAILED DESCRIPTION

In the following detailed description, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

FIG. 1 shows a perspective view of a flip chip 100 having solder bumps 110 being attached to a surface 120, implemented in accordance with the present invention. The flip chip 100 has a number of circuit devices formed therein. The circuit devices are located near the bumps 110. Generally located below each of the bumps is a pad (shown in FIGS. 4A–4H). The pads and bumps 110 formed on each pad are located on the interconnect surface 130 of the flip chip 100. The interconnect surface 130 can be on the parallel surface of the chip, although this is generally not done since the vias to the devices are shorter and the electrical paths are also shorter when the pads are placed on the surface closest to the epitaxial layer of the chip. The arrow 140 in FIG. 1 shows the direction that the chip 100 is rotated to properly position the chip over the surface 120. It should be noted that surface 120 has a corresponding number of bumps 122 thereon.

Figure 2:
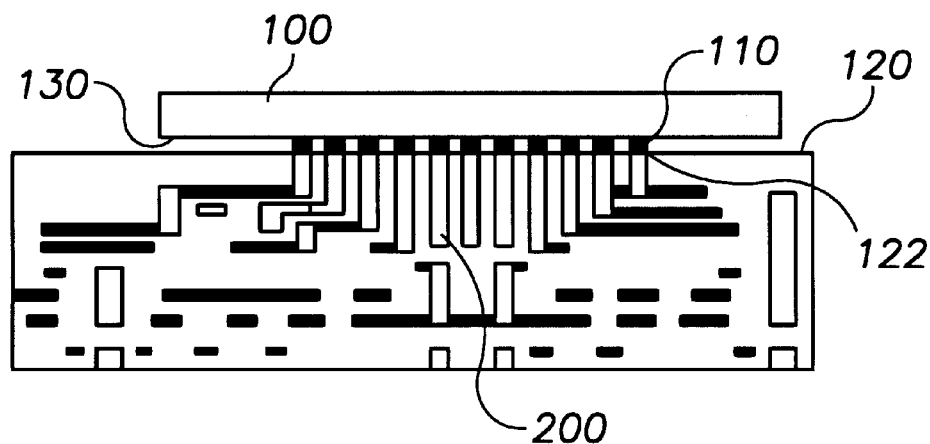
FIG. 2 shows a cross sectional view of a flip chip, consistent with the invention described herein, having solder bumps attached a surface.

FIG. 2 shows a cross sectional view of a flip chip 100 after having been attached to the surface 120, implemented in accordance with the present invention. The surface 120 can be a packaging device for the flip chip 100. The surface 120 includes circuitry 200. If the surface is a packaging device, the circuitry 200 carries signals to another information handling system formed of various semiconductor devices and other devices. The surface 120 can also be associated with another semiconductor device.

Figure 3:
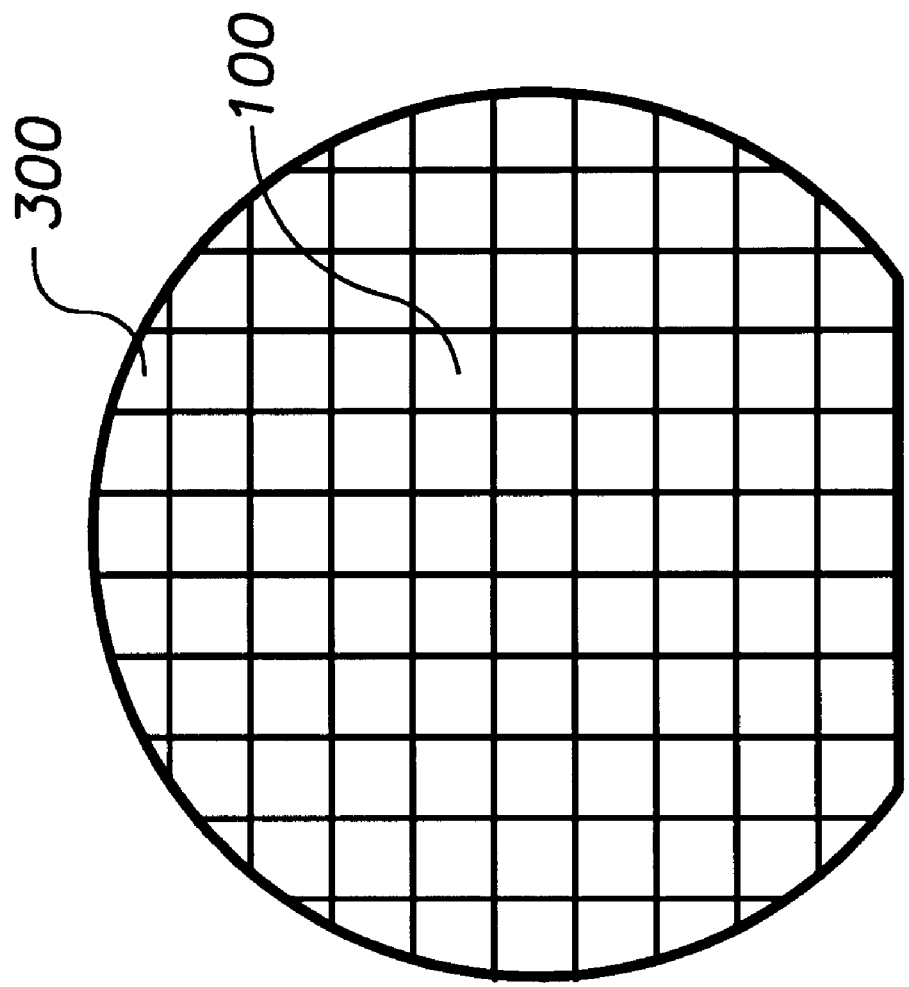
FIG. 3 shows a top view of a wafer, consistent with the invention described herein.

FIG. 3 shows a top view of a wafer 300, implemented in accordance with the present invention. A wafer 300 is generally made of very pure silicon. The wafer undergoes many process steps to form a plurality of layer of semiconductor devices. The process steps include the basic operations of layering, patterning, doping and heating. The end result is a wafer having many substantially identical chips 100 or die. One of the last process steps for the wafer 300 is to provide pads (shown in FIGS. 4A–4H) and to form solder bumps 10 on the pads of all the chips 100 shown on the wafer 300. The bumps 110 are formed by depositing solder on each of the pads on the wafer. Each chip is represented as a rectangle or square on the wafer 300. Each chip 100 in the wafer 300 can have a large number of pads. Although the pads and bumps are not shown in FIG. 3, typically, there are 10–1,000 pads per chip and 300 chips per wafer 300. In other words a wafer 300 full of chips 100 can have anywhere from 3,000 to 300,000 pads to be covered with bumps 100. Of course, as time goes on the number of electronic transistors and other circuit components that can be formed in a chip will increase which in turn will increase the number of input/output pads for each chip 100. After all the process steps are complete and the individual chips are tested, the wafer 300 is diced or cut along the lines shown to produce the individual chips 100.

FIGS. 4A–4H show cross-sectional views of successive process steps in a process for forming solder balls on the pads 400 of a number of chips on a wafer 300. Although only two pads are shown, it should be remembered that the process is used to form solder balls on a multiplicity of pads 400 across the surface of a wafer 300. It should also be noted that the process could be readily adapted for forming solder balls on other surfaces such as the surface of a ball grid array (BGA) package which holds an individual chip 100.

Figure 4A:
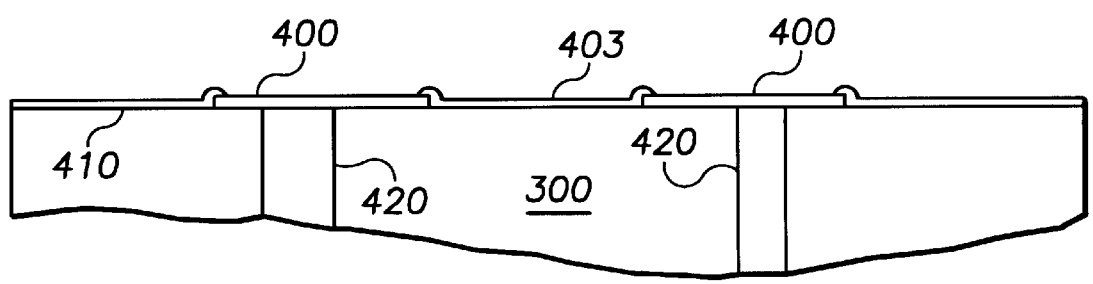
FIGS. 4A–4H show cross-sectional views of successive process steps in a process for forming solder balls on the pads of dies.
Figure 4B:
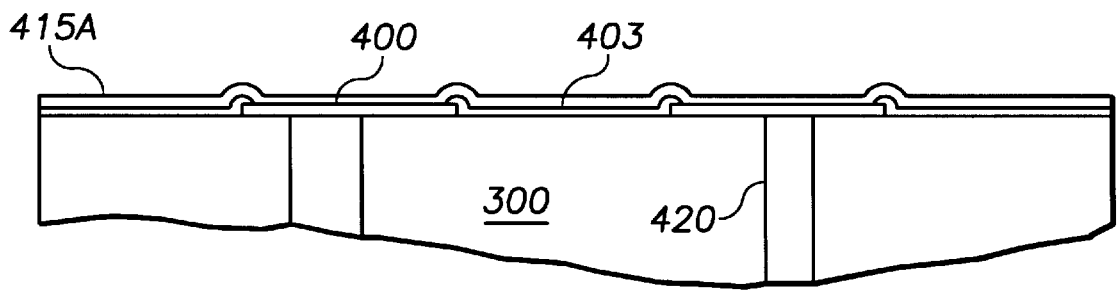

Now turning to FIG. 4A, a wafer 300 with a plurality of electrical contact pads 400 and die passivation layer 403 formed on the surface 410 is used as the starting material for the high speed bump plating/forming process. Step 1, shown in FIG. 4B, is to deposit a metal layer 415A onto the surface of the wafer that is used to form the bond limiting metallization areas 415B (in FIG. 4D). Sputtering, evaporation, or other methods may be used to accomplish the deposition. The bond limiting metallization areas 415B shown in FIG. 4D are shown as relatively thick for the sake of illustration. In actuality, the bond limiting metallization areas 15B are approximately 1 to 2 micron thick.

Figure 4C:
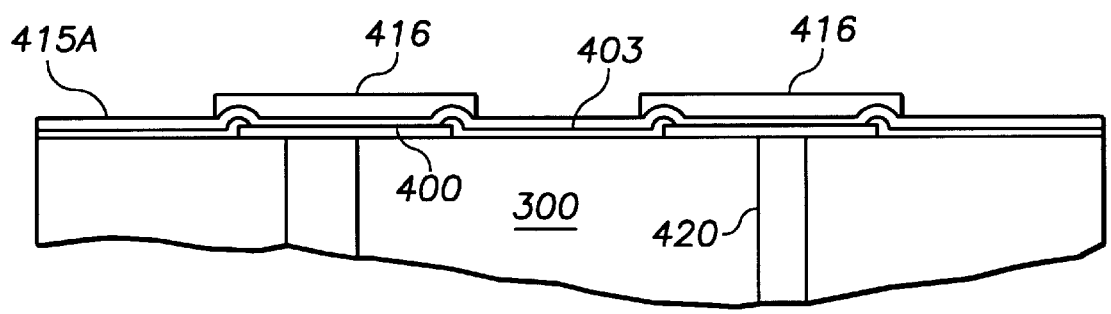
Figure 4D:
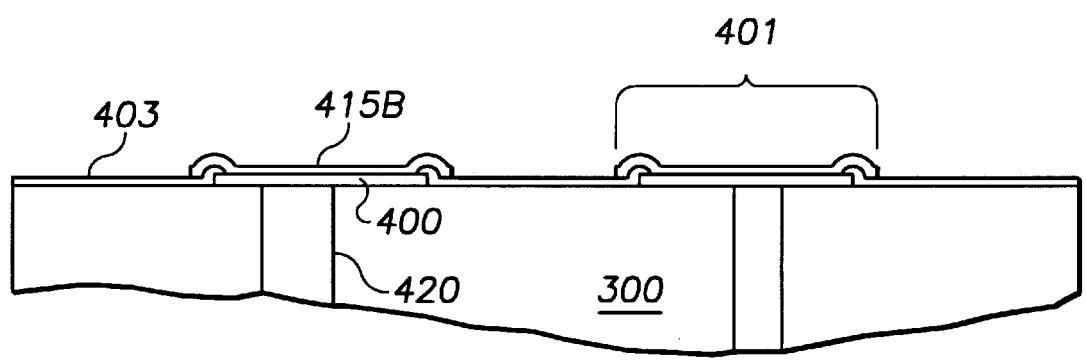

Now turning to FIGS. 4C and 4D, the bond metallization layer 415A in FIG. 4C structured to form areas 415B that form part of individual bond metallization sites 401. Each bond metallization site 401 is generally associated with a pad 400. In Step 2, a bond limiting metallization mask 416 is formed using a typical resist mask as shown in FIG. 4C. In Step 3, the component of the bond limiting metallization layer 415A not to be part of the final bond metallization sites 401 is removed by etching, resulting in a bond limiting metallization site 401 as in FIG. 4D. The bond limiting metallization sites 401 are the areas on which the solder bumps are formed. The bond limiting metallization sites 401 are typically electrically connected to vias 420. The vias 420 are connected to the semiconductor devices formed in previous process steps on the wafer 300.

Figure 4E:
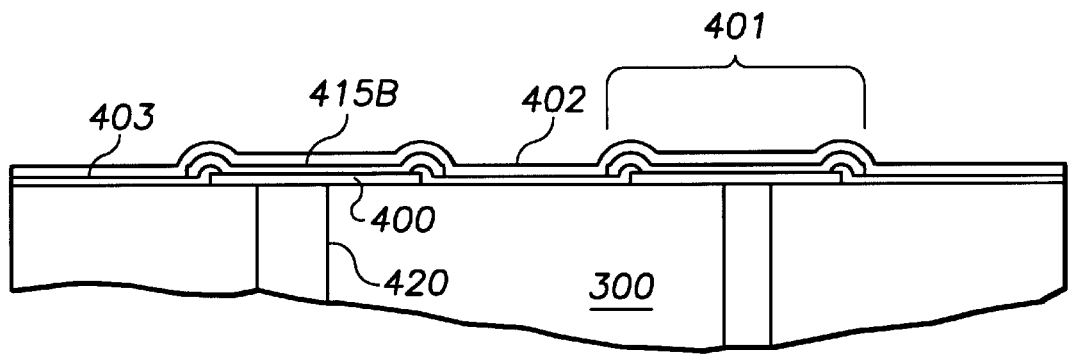

In Step 4, a plating base 402 is deposited on the surface of the wafer 300 and over the bond limiting metallization sites 401, as in FIG. 4E. The plating base can be sputtered-on or placed on the surface by vapor deposition. The plating base is any metal or metal system that will be alloyed with the solder. In this instance, the plating base is formed of copper.

Figure 4F:
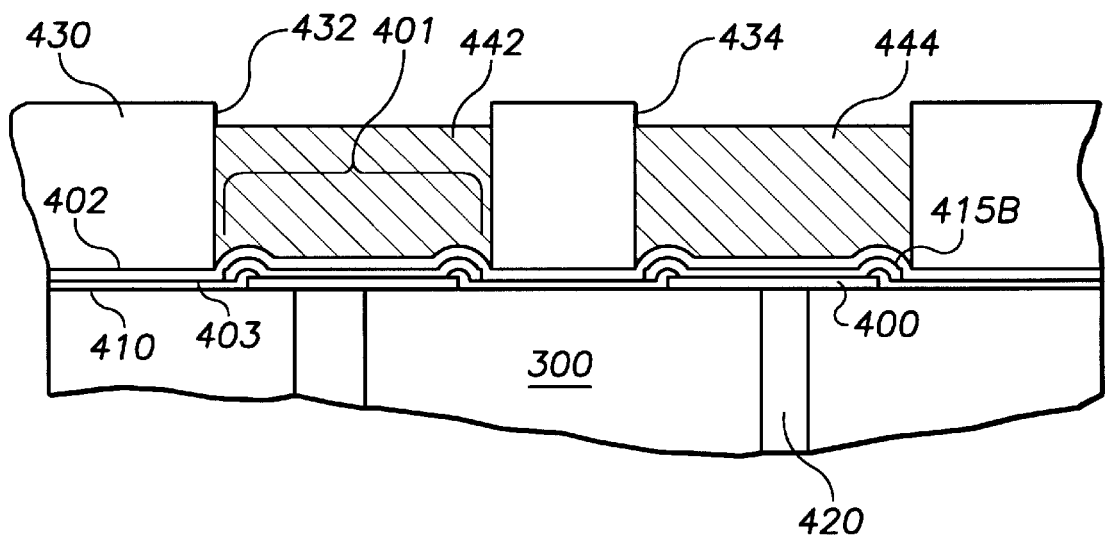

After the bond limiting metallization sites 401 are formed, a mask 430 for solder is formed on the plating base metallization 402 in Step 5, as in FIG. 4F. The mask 430 is formed with a wet or dry material. The mask 430 has a thickness in the range of 20–100 microns. An opening 432 is formed in the mask 430. The opening 432 has an area larger than the area associated with the bond limiting metallization sites 401 covered by a plating layer 402. In other words, at the surface 410 of the wafer within the opening 432 is a bond limiting metallization site 401. The covered bond limiting metallization site 401 at the bottom of each opening 432 covers an area of the semiconductor which is smaller than the area at the bottom of the opening.

In Step 6, a tin/lead solder 442 of about 20 microns thick is plated within the opening 432, as in FIG. 4F. It should be noted that the solder deposits 442 and 444 are of substantially the same thickness. Each of the solder deposits 442 and 444 fills the opening 432 and 434 in the mask 430 to substantially the same level. The solder deposits 442 and 444 are deposited at a rate where a uniform thickness must result from the solder depositing step. As shown in FIG. 4F, the solder is electroplated onto the wafer 300 having the openings 432 and 434 therein. The amount of time for electroplating can be reduced since a uniform thickness of solder over an area larger than the bond limiting metallization site 401 allows the necessary volume of solder to be deposited in ½ to ⅓ the time. Of course, the amount of time reduced depends directly on how much larger an area is compared to the bond limiting metallization sites 401. As a result, the process time and particularly the throughput time for adding solder bumps 442 and 444 can be lessened.

Figure 4H:
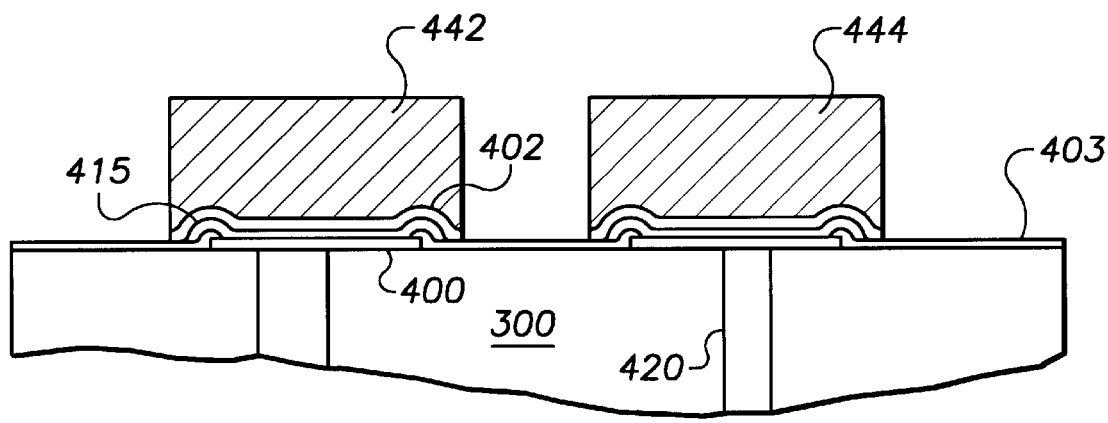
Figure 4G:
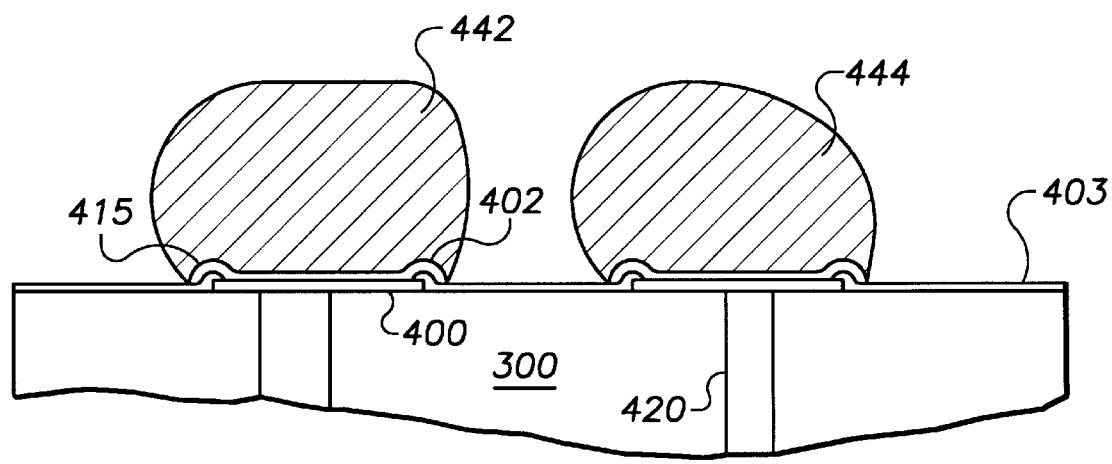

In Step 7, the mask 430 is then etched away (either by wet etching or with a dry etch) or removed to leave substantially uniform solder "deposits" 442 and 444, as shown in FIG. 4G. The portion of the plating layer 402 beneath the mask 430 is also etched away either by wet etching or with a dry etch. The final step, shown by FIG. 4H, is to reflow the solder. Heat is applied to reflow the solder balls 442 and 444 on the surface of the wafer, thereby wetting the pads 400 on the surface of the wafer 300. The reflow process consumes the plating layer 402. During the reflow process the metal in the plating layer 402 mixes or alloys with the solder ball 442 and 444 associated with the particular portion of the layer. Surface tension of the solder and the metal alloyed therewith forms the solder ball 442 and 444 into the bump 110 which is placed directly over the bond limiting metallization areas 415B. Each bump 110 is uniform since there was substantially the same volume of solder and plating material 402 associated with each bond limiting metallization area 415B.

Further processing steps include cutting or dicing the wafer 300 into individual chips 100. These further processing steps are conventional and need not be repeated herein. Likewise various ones of the processing steps disclosed herein may be combined with other steps as is apparent to those skilled in the art.

Above example embodiments of the present invention can include numerous variations to the embodiment described above. For instance, the chips on the wafer 300 can be made of various sizes. The solder masks can be formed with openings with varying amounts of surface area. In addition, different types of deposition can also be used to deposit solder into the openings 432 and 434 of the mask 430. In addition, the pattern of the bumps 110 on each chip may be changed. In addition, this invention is not limited to forming bumps on wafers 300 but can also be implemented to form bumps on any package requiring a large number of bump type electrical contacts of uniform size and other substrates such as MCM's and PCB's.

Figure 5:
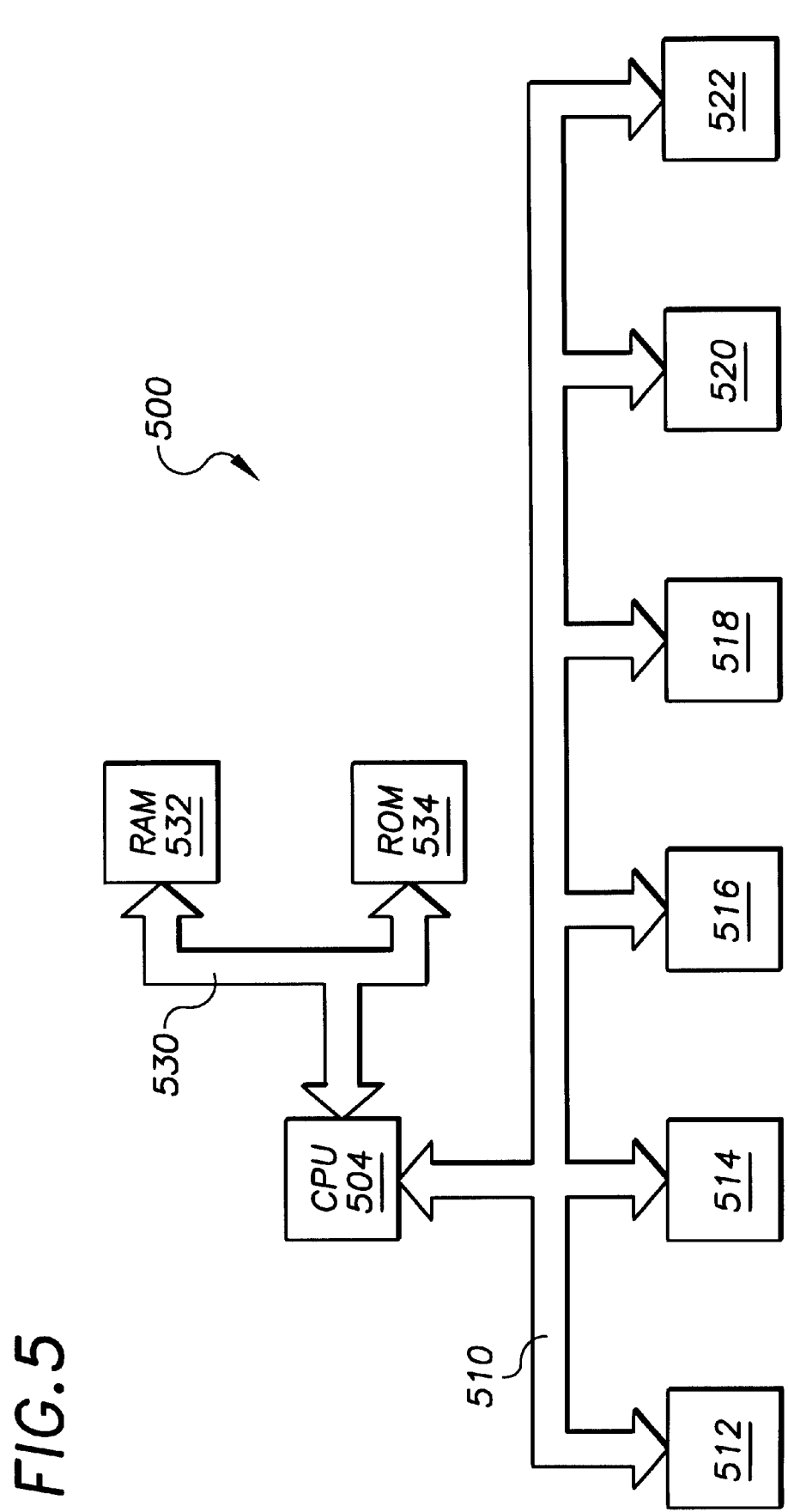
FIG. 5 is a schematic of an information handling system.

Advantageously, the invention is well-suited for use on any semiconductor device such as chips having a microprocessors or memory therein. The chips formed by this process can be used in any electronic system, such as the information handling system 500 as shown in FIG. 5. The information handling system 500 includes a central processing unit 504, a random access memory 532 a read only memory 534, and a system bus 530 for communicatively coupling the central processing unit 504 and the random access memory 532. The information handling system 500 includes a device formed by the steps shown in FIGS. 4A–4H, as described above. The system 500 may also include an input/output bus 510 and several devices peripheral devices, such as 512, 514, 516, 518, 520, and 522 may be attached to the input output bus 510. Peripheral devices may include hard disk drives, floppy disk drives, monitors, keyboards and other such peripherals.

The present invention has been described with reference to particular embodiments. These embodiments are only examples of the invention's application and should not be taken as a limitation. Various adaptations and combinations of features of the embodiments disclosed are within the scope of the present invention as defined by the following claims.

What is claimed is:

1. A method for depositing solder on the pads of a semiconductor device comprising the steps of:

forming a plurality of bond limiting metallization sites;

depositing plating base metallization on the semiconductor device;

placing a mask over the plating base metallization on the semiconductor device and forming openings therein, each of the openings disposed over one of the sites and with each of the openings exposing a larger surface area of plating base metallization than the area of the bond limiting metallization site underlying said opening;

depositing solder in the openings of the mask and over the plating base metallization;

removing the mask;

removing the exposed plating base metallization; and reflowing the solder to form the solder bumps on the semiconductor device.

2. The method of claim 1 wherein the step of forming the openings includes the step of forming openings having approximately the same area such that a substantially uniform volume of solder is placed on each pad.

3. The method of claim 2 wherein the step of depositing solder through the mask is done at a rate to produce a substantially uniform thickness across the semiconductor device.

4. The method of claim 3 wherein the step of reflowing the solder forms substantially uniform solder balls on each pad.

5. The method of claim 1 wherein the step of removing the mask includes the step of wet etching.

6. The method of claim 5, wherein the plating base metallization under the mask is also removed.

7. The method of claim 1 wherein the step of removing the mask includes the step of etching with a dry etch.

8. The method of claim 7, wherein the plating base metallization under the mask is also removed.

9. The method of claim 1 wherein the semiconductor device is a wafer including a plurality of individual chips.

10. The method of claim 1 wherein a plating material is deposited on the wafer over said bond limiting metallization sites before placing the mask on the bond limiting metallization sites.

11. A method for depositing solder on the pads of a semiconductor device comprising the steps of:

forming a plurality of pads on a substrate with a passivation layer disposed on the substrate and over the edges of the pads, such that the passivation layer has openings over the pads that are smaller than the pads thereby exposing the surface of the pads;

forming a bond metallization member over each of the pads and a portion of the passivation layer at the edges of the pads, thereby forming a plurality of bond limiting metallization sites on the substrate;

depositing a plating base metallization on the semiconductor device;

placing a mask over the plating base metallization on the semiconductor device and forming openings therein, each of the openings disposed over one of the sites and with each of the openings exposing a larger cross sectional area of plating base metallization than the area of the bond limiting metallization sites underlying said opening;

depositing solder in the openings of the mask and over the plating base metallization;

removing the mask;

removing the exposed plating base metallization; and reflowing the solder to form the solder bumps on the semiconductor device.

12. The method of claim 11, wherein the step of forming the bond metallization sites includes the steps of:

forming metal layer over the pads and the passivation layer;

forming a mask over each of the pads and on the metal layer and a portion of the passivation layer;

removing exposed portions of the metal layer; and removing the mask.

13. The method of claim 11 wherein the step of forming the openings includes the step of forming openings having approximately the same area such that a substantially uniform volume of solder is placed on each pad.

14. The method of claim 13 wherein the step of depositing solder through the mask is done at a rate to produce a substantially uniform thickness across the semiconductor device.

15. The method of claim 11 wherein the step of removing the mask includes the step of wet etching.

16. The method of claim 15, wherein the plating base metallization under the mask is also removed.

17. The method of claim 11 wherein the step of removing the mask includes the step of etching with a dry etch.

18. The method of claim 17, wherein the plating base metallization under the mask is also removed.

19. The method of claim 11 wherein a plating material is deposited on the wafer over said bond limiting metallization sites before placing the mask on the bond limiting metallization sites.

20. A method for depositing solder on the pads of a semiconductor device comprising the steps of:

forming a plurality of bond limiting metallization sites;

depositing and patterning a plating base metallization layer such that plating base members are formed overlying each bond limiting metallization site, each plating base member having a perimeter larger than the bond limiting metallization site;

placing a mask over the plating base metallization layer and forming openings therein, each of the openings disposed over one of the sites and with each of the openings exposing a larger surface area of plating base metallization than the area of the bond limiting metallization site underlying said opening;

depositing solder in the openings of the mask and over the plating base metallization layer;

removing the mask; and reflowing the solder to form the solder bumps.

* * * * *

UNITED STATES PATENT AND TRADEMARK OFFICE
CERTIFICATE OF CORRECTION

PATENT NO. : 6,162,718
DATED : December 19, 2000
INVENTOR(S) : Boettcher

It is certified that error appears in the above-identified patent and that said Letters Patent is hereby corrected as shown below:

Drawings,
"FIG. 4H", should be -- FIG. 4G --.
"FIG. 4G", should be -- FIG. 4H --.
FIG. 4G and 4H, number "415" should be -- 415B -- in both figures.
In the correct FIG. 4H, number "402" should not be on this drawing.

Column 1,
Line 41, "while those of ultrathin packages" should read -- while those of ultra thin packages --.

Column 2,
Line 2, "usually solder, or" should read -- usually solder or --.

Column 5,
Line 29, "metallization areas 15B" should read -- metallization areas 415B --.

Column 6,
Lines 21 and 22, "away either by wet etching or with a dry etch." should read -- away (either by wet etching or with a dry etch). --.
Line 54, "the invention is well-suited" should read -- the invention is well suited --.
Line 54, "access memory 532 a read only" should read -- access memory 532, a read only --.

Signed and Sealed this

Twenty-second Day of July, 2003

JAMES E. ROGAN
*Director of the United States Patent and Trademark Office*